(12) United States Patent
Yamada et al.

(10) Patent No.: US 6,992,913 B2
(45) Date of Patent: Jan. 31, 2006

(54) FERROELECTRIC STORAGE DEVICE

(75) Inventors: Takayoshi Yamada, Takatsuki (JP); Yoshihisa Kato, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/041,251

(22) Filed: Jan. 25, 2005

(65) Prior Publication Data

US 2005/0162890 A1   Jul. 28, 2005

(30) Foreign Application Priority Data

Jan. 28, 2004 (JP) .............................. 2004-020490

(51) Int. Cl.
*G11C 11/22* (2006.01)
(52) U.S. Cl. ...................................... 365/145; 365/149
(58) Field of Classification Search ................ 365/145, 365/149, 189.08, 189.06
See application file for complete search history.

(56) References Cited

U.S. PATENT DOCUMENTS

| 5,325,050 A | * | 6/1994 | Sameshima ............. 324/103 P |
| 5,434,811 A | * | 7/1995 | Evans et al. ................. 365/145 |
| 5,541,870 A | * | 7/1996 | Mihara et al. .............. 365/145 |
| 6,707,702 B1 | * | 3/2004 | Komatsuzaki .............. 365/145 |
| 2005/0180220 A1 | * | 8/2005 | Chen et al. ............ 365/189.01 |

FOREIGN PATENT DOCUMENTS

JP        2001-308291 A    11/2001

* cited by examiner

*Primary Examiner*—Anh Phung
*Assistant Examiner*—Hien Nguyen
(74) *Attorney, Agent, or Firm*—McDermott Will & Emery LLP (57) ABSTRACT

In the present invention, a polarization having a lower polarization level than a saturation polarization is caused in a ferroelectric capacitor by applying a voltage that is lower than a saturation voltage to the ferroelectric capacitor. This allows a storage device to store many values by changing a length of a write-time during which the voltage is applied to the capacitor.

5 Claims, 13 Drawing Sheets

FERROELECTRIC STORAGE DEVICE

CROSS-REFERENCE TO RELATED APPLICATIONS

This application is based on application No. 2004-020490 filed in Japan, the contents of which are hereby incorporated by reference.

BACKGROUND OF THE INVENTION (1) Field of the Invention

The present invention relates to a storage device using a ferroelectric material, in particular to a technique for improving reliability of the storage device at a time of rewriting data.

(2) Description of the Related Art

In recent years, ferroelectric memories (FeRAM: ferroelectric random access memory) using a ferroelectric material have been developed actively. The ferroelectric memories are characterized by having nonvolatility and being rewritable at high-speed. However, the ferroelectric memories can be rewritten only a limited number of times, because fatigue and deterioration of their ferroelectric films gradually progress as the memories are rewritten repeatedly.

The fatigue and the deterioration are caused by an inversion of a polarization. To suppress the fatigue and the deterioration, an asymmetric programming method has been developed, in which data "1" is represented by a positive saturation polarization, and data "0" is represented by a polarization that is approximate to a zero polarization (e.g. Japanese laid-open patent publication No. 2001-308291). This method reduces the change in a polarization level, and thereby suppresses the fatigue and the deterioration of the ferroelectric film. Accordingly, this increases the limit on the number of rewritings.

For realizing higher rewriting speed in such ferroelectric memories using the asymmetric programming method, it is necessary to shorten the time required for rewriting each piece of data.

However, if the time for the rewriting is shortened, a rewriting failure might occur. This decreases the reliability of the ferroelectric memories.

SUMMARY OF THE INVENTION

The object of the present invention is therefore to provide a ferroelectric memory capable of shortening a time required for rewriting, and at the same time, improving reliability of the memory at a time of rewriting data.

The above object is fulfilled by a ferroelectric storage device, comprising: a ferroelectric capacitor; a write-voltage applying circuit operable to apply a write-voltage to the ferroelectric capacitor and thereby cause polarization in the ferroelectric capacitor; and a write-time control circuit operable to control a length of a write-time during which the write-voltage applying circuit applies the write-voltage to the ferroelectric capacitor, wherein the write-time control circuit changes the length of the write-time in accordance with a level of the write-voltage.

Especially, it is preferable that the write-time control circuit increases the length of the write-time as an absolute value of the write-voltage decreases.

In the conventional technique, the write-time during which the write-voltage is applied to the ferroelectric capacitor is constant regardless of the level of the write-voltage. However, with the stated construction, the ferroelectric storage device can shorten the write-time when the level of the write-voltage is high, because the reliability can be kept even if the write-time is short when the level of the write-voltage is high. Also, the ferroelectric storage device can improve the reliability when the write-voltage is low, by increasing the write-time.

Note that a write-time control circuit may be included in a read/write unit 60 and a write unit 66 and so on as in FIG. 1 described later, and may be an individual unit separated from the read/write unit 60 and the write unit 66 and so on as in FIG. 13.

Also, the write-voltage applying circuit may change an absolute value of the write-voltage for each polarization level corresponding to a value that is to be stored in the ferroelectric capacitor.

In the case of a ferroelectric memory using the asymmetric programming method, if the ferroelectric memory applies a saturation voltage to store a value "1" and applies a voltage having a smaller absolute value to store a value "0", it is possible to realize a required polarization state in short time when applying the saturation voltage. However, when applying the voltage having the smaller absolute value, it is necessary to applying the voltage during a write-time that is in accordance with the level of the voltage until the polarization state becomes stable. The present invention can improve the writing speed of the ferroelectric memory using the asymmetric programming method, shorten the time for the rewriting, and improve the reliability of the memory.

Also, the ferroelectric storage device according to the present invention may be the ferroelectric capacitor that stores three or more values.

The stated structure can increase the storage capacity of each memory cell to realize a highly integrated ferroelectric memory, and improve the reliability and the writing speed of such ferroelectric memory.

The ferroelectric storage device according to the present invention may be a ferroelectric storage device, comprising: a pair of ferroelectric capacitors; a write-voltage applying circuit operable to apply a different write-voltage to each ferroelectric capacitor, and thereby cause a polarization in each ferroelectric capacitor; and a write-time control circuit operable to control a length of a write-time during which the write-voltage applying circuit applies the write-voltage to each ferroelectric capacitor, wherein the write-time control circuit changes the length of the write-time in accordance with a level of the write-voltage.

The stated structure can improve the accuracy for reading stored data even when the level of the polarization in the ferroelectric capacitor is small.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENTS

The following describes a ferroelectric storage device according to preferred embodiments of the present invention by taking a ferroelectric memory as an example, with reference to drawings.

1. The First Embodiment

A ferroelectric memory according to the first embodiment is a ferroelectric memory that stores two values, namely "1" and "0", with use of the asymmetric programming method.

1-1. The Structure of the Ferroelectric Memory

Figure 1:
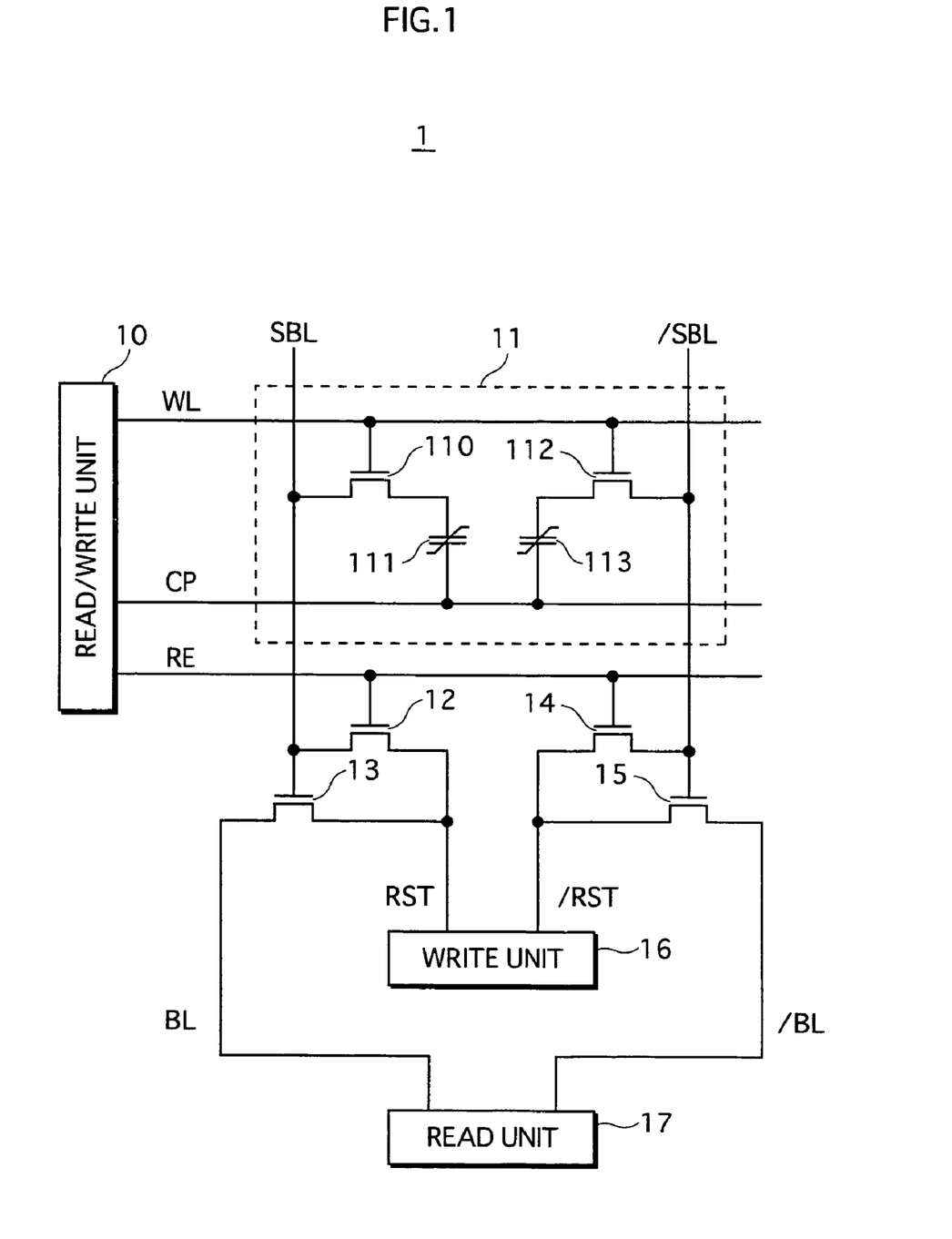
FIG. 1 shows a circuit structure of a memory cell included in a ferroelectric memory according to the first embodiment, and peripheral circuits.

FIG. 1 shows a circuit structure of a memory cell included in the ferroelectric memory according to the first embodiment, and peripheral circuits. As FIG. 1 shows, a memory cell 11 included in a ferroelectric memory 1 stores information with use of two field-effect transistors 110 and 112, and two ferroelectric capacitors 111 and 113. This circuit structure is called 2T2C-type structure. The ferroelectric memory 1 includes, as the peripheral circuits, a read/write unit 10, a write unit 16, a read unit 17, and transistors 12 to 15.

The read/write unit 10 drives a word line WL, a memory cell plate line CP, and a reading control line RE. The write unit 16 drives reset control lines RST and /RST. The read unit 17 drives bit lines BL and /BL.

1-2. The Writing Operation Performed by the Ferroelectric Memory 1

The operation of writing data into the memory cell 11 is described next.

(1) The Operation of Writing a Value "1"

Figure 2:
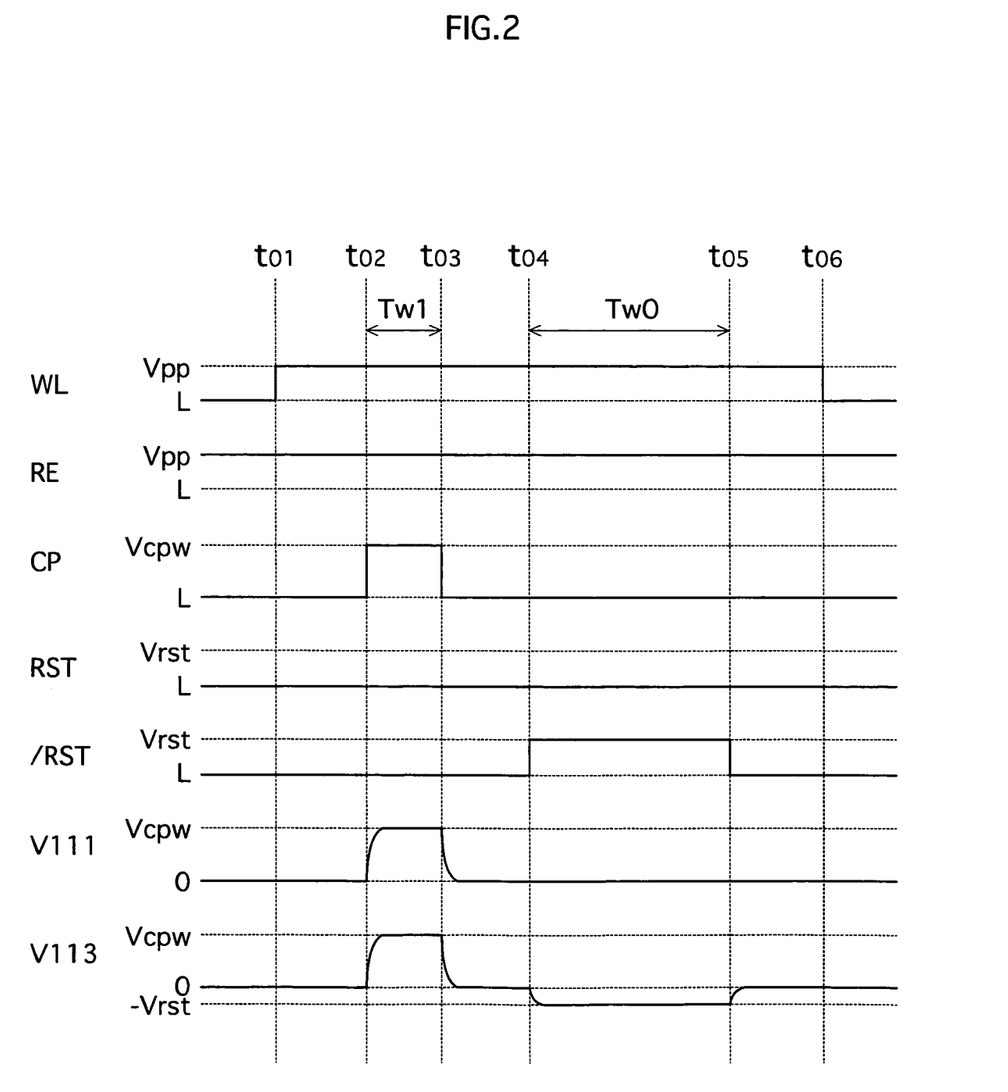
FIG. 2 is a timing chart in the case of writing a value "1" into a memory cell 11.

FIG. 2 is a timing chart in the case of writing a value "1" into the memory cell 11. In FIG. 2, signs t01 to t06 represent times respectively, and time advances in the order from t01 to t06. A sign "L" shows that an applied voltage is at a low level. As an example, it is assumed here that the low level is 0.0 V, Vpp is 2.8 V, Vcpw is 1.8 V, and Vrst is 1.0 V.

Before the time t01, the voltage applied to the word line WL is at the low level. The voltage applied to the reading control line RE is at the Vpp level, and the voltages applied to the memory cell plate line CP and the reset control lines RST and /RST are all at the low level. Also, both the voltages applied to the ferroelectric capacitors 111 and 113, namely V111 and V113, are 0 V.

At the time t01, the ferroelectric memory 1 changes the level of the voltage applied to the word line WL to the Vpp level. This turns on the field-effect transistors 110 and 112. At the time t02, the ferroelectric memory 1 changes the level of the voltage applied to the memory cell plate line CP to Vcpw. This raises the voltages V111 and V113 to Vcpw. In this embodiment, the period in which the voltage Vcpw is applied to the memory cell plate line CP, that is a period Tw1 between the time t02 and the time t03, is 30 nsec.

At the time t03, the ferroelectric memory 1 changes the level of the voltage applied to the memory cell plate line CP to the ground potential. This lowers the voltages V111 and V113 to 0 V. At the time t04, the ferroelectric memory 1 changes the level of the voltage applied to the reset control line /RST to Vrst. This further lowers the voltage V113 to −Vrst. In this embodiment, the period in which the voltage Vrst is applied to the reset control line /RST, that is a period Tw0 between the time t04 and the time t05, is 150 nsec.

At the time t05, the ferroelectric memory 1 changes the level of the voltage applied to the reset control line /RST back to the voltage at the low level. After that, the ferroelectric capacitor 113 does not receive the voltage any longer. In other words, the voltage V113 rises to 0 V. Finally, at the time t06, the level of the voltage applied to the word line WL is changed to the voltage at the low level. Then, the writing operation finishes.

(2) The Operation of Writing a Value "0"

Figure 3:
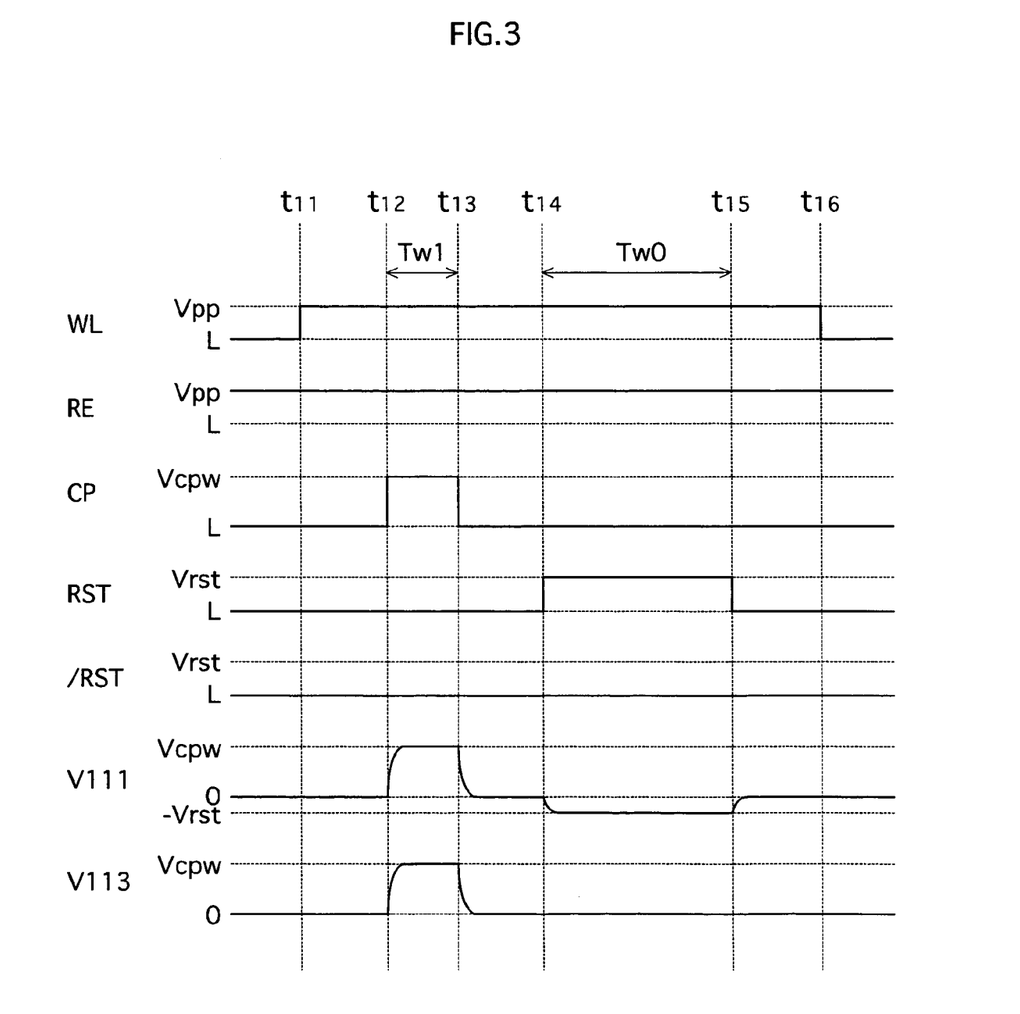
FIG. 3 is a timing chart in the case of writing a value "0" into a memory cell 11.

FIG. 3 is a timing chart in the case of writing a value "0" into the memory cell 11. In FIG. 2, time advances in the order from t11 to t16 in the same manner as in FIG. 1. A sign "L" shows that an applied voltage is at a low level. As an example, it is assumed here that the low level is 0.0 V, Vpp is 2.8 V, Vcpw is 1.8V, and Vrst is 1.0 V. Before the time t11, the voltages are in the same states as the voltages before the time t01 in FIG. 2.

At the time t11, the ferroelectric memory 1 changes the level of the voltage applied to the word line WL to the Vpp level and thereby turns on the field-effect transistors 110 and 112. At the time t12, the ferroelectric memory 1 changes the level of the voltage applied to the memory cell plate line CP to Vcpw, and thereby raises the voltages V111 and V113 to Vcpw. In this embodiment, the period in which the voltage Vcpw is applied to the memory cell plate line CP, that is a period Tw1, is 30 nsec. This is the same value as the above.

At the time t13, the ferroelectric memory 1 changes the level of the voltage applied to the memory cell plate line CP to the ground potential and thereby lowers the voltages V111 and V113 to 0 V. At the time t14, the ferroelectric memory 1 changes the level of the voltage applied to the reset control line /RST to Vrst. This further lowers the voltage V111 to −Vrst. The period in which the voltage Vrst is applied to the reset control line /RST, that is a period Tw0, is 150 nsec.

At the time t15, the ferroelectric memory 1 changes the level of the voltage applied to the reset control line /RST back to the voltage at the low level. After that, the ferroelectric capacitor 111 does not receive the voltage any longer. In other words, the voltage V111 rises to 0 V. Finally, at the time t16, the level of the voltage applied to the word line WL is changed to the voltage at the low level. Then, the writing operation finishes.

1-3. The Control of the Polarizations State of the Ferroelectric Capacitors

How to control polarization states of the ferroelectric capacitors 111 and 113 is described next.

Figure 4:
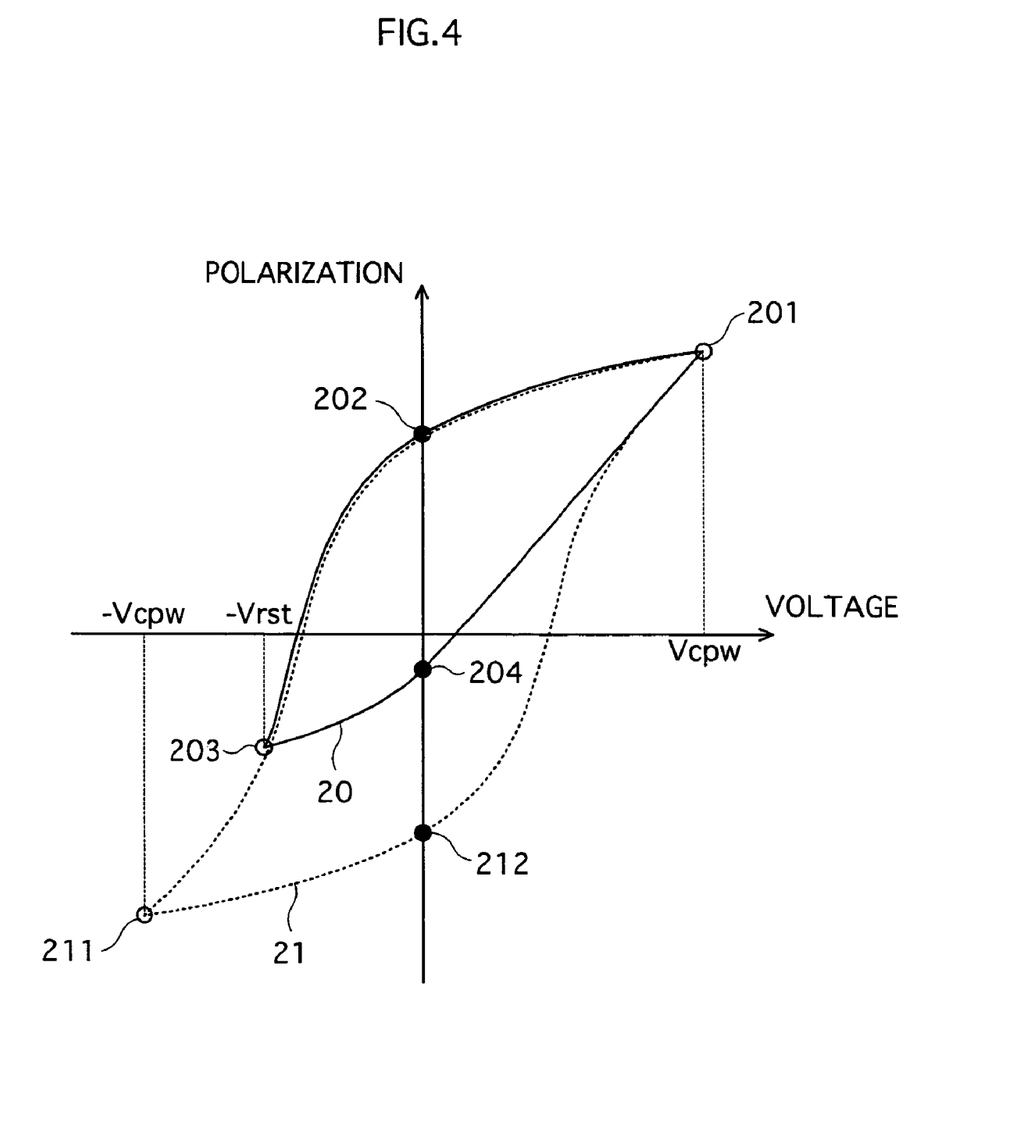
FIG. 4 is a graph showing hysteresis curves of ferroelectric capacitors 111 and 113 according to the first embodiment of the present invention.

FIG. 4 shows the hysteresis curves of the ferroelectric capacitors 111 and 113. In FIG. 4, a solid line 20 is a hysteresis curve of the ferroelectric capacitors 111 and 113 according to this embodiment. A broken line 21 is a hysteresis curve of a ferroelectric capacitor that uses asymmetric programming method.

As FIG. 4 shows, the hysteresis curve 21 represents a transition of the polarization state, in which the polarization state changes from a polarization state represented by a dot 201 to polarization states represented by dots 202, 203, 211 and 212 in this order. Then, the polarization state changes back to the state represented by the dot 201. The ferroelectric capacitor relating to the hysteresis curve 21 comes in the polarization state 201 when the ferroelectric memory 1 applies the voltage Vcpw to the ferroelectric capacitor. Then, when the ferroelectric memory 1 stops applying the voltage Vcpw, the ferroelectric capacitor comes in the polarization state 202. This polarization state 202 represents the value "1". Also, the ferroelectric capacitor comes in the polarization state 211 when the ferroelectric memory 1 applies an inverse voltage −Vcpw, which has the same absolute value as the Vcpw, to the ferroelectric capacitor. Then, when the ferroelectric memory 1 stops applying the inverse voltage −Vcpw to the ferroelectric capacitor, the ferroelectric capacitor comes in the polarization state 212. This polarization state 212 represents the value "0".

Meanwhile, the hysteresis curve 20 of the ferroelectric capacitors 111 and 113 according to the embodiment represents a transition of the polarization state, in which the polarization state changes from a polarization state 201 to polarization states 202, 203 and 204 in this order, and then changes back to the polarization state 201. The ferroelectric capacitors 111 and 113 come in the polarization state 201 when the ferroelectric memory 1 applies a voltage Vcpw to the ferroelectric capacitors 111 and 113 respectively. Then, when the ferroelectric memory 1 stops applying the voltage Vcpw, the ferroelectric capacitors come in the polarization state 202. This polarization state 202 represents the value "1", which is the same as the symmetry driving method. When the ferroelectric memory 1 applies the voltage −Vrst to the ferroelectric capacitors 111 and 113, the ferroelectric capacitors 111 and 113 come in the polarization state 203. Then, when the ferroelectric memory 1 stops applying voltage −Vrst to the ferroelectric capacitors 111 and 113, the ferroelectric capacitors 111 and 113 come in the polarization state 204.

Also, in the symmetry driving method, the period for applying Vcpw and the period for applying −Vcpw have almost the same length, and therefore the holding time of the polarization state 201 and the holding time of the polarization state 211 are almost the same. Meanwhile, in this embodiment, the holding time of the polarization state 201 and the holding time of the polarization state 203 are different as described above.

1-4. The Relation Between Voltage-applying Time and Data-holding Characteristic

Figure 5:
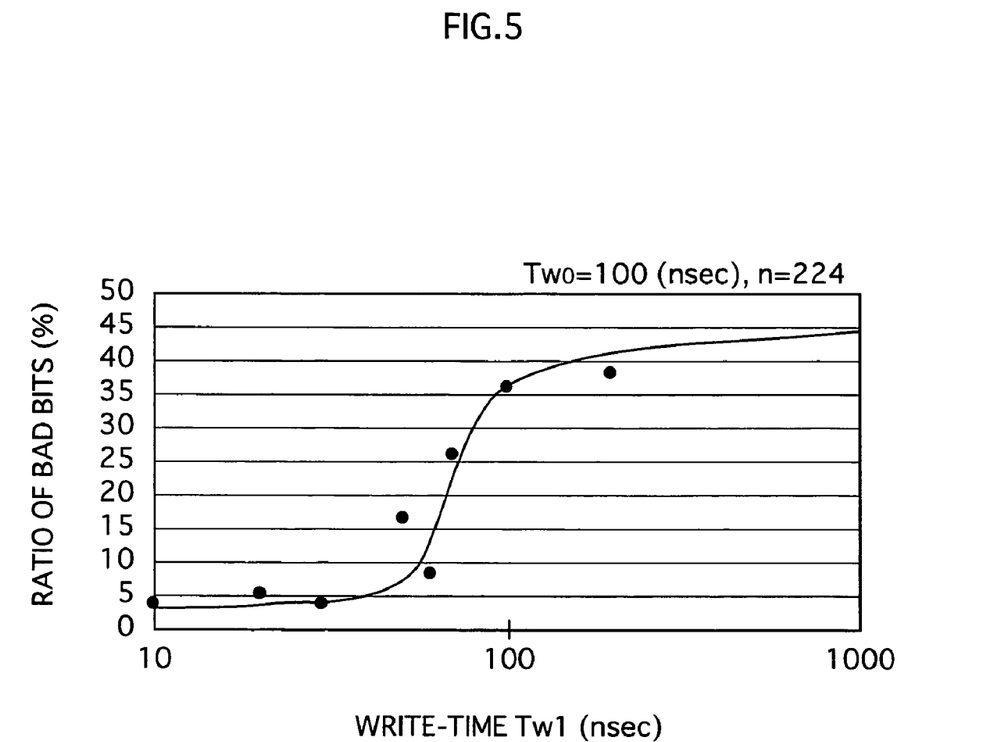
FIG. 5 is a graph showing a ratio of bad bits (unreadable bits) in the case of changing a length of a write-time for applying a write-voltage for writing a value "1" into a ferroelectric memory 1 according to the first embodiment of the present invention.

The following describes experimental data relating to the relation between the length of time during which voltages are applied and data-holding characteristic in the ferroelectric memory 1 according to the first embodiment. FIG. 5 is a graph showing a ratio of bad bits (unreadable bits) in the case of changing the time length for applying voltages for writing the value "1" into the ferroelectric memory 1. The memory used in this experiment is a 2T2C (two transistors, two capacitors)-type ferroelectric memory using 0.18 μm process. The source voltage is 1.8 V, the voltage Vcpw for writing the value "1" is 1.8 V, and the voltage Vrst for writing the value "0" is 1.3 V. The values are written into the n-bit (n=224) memory cell of the memory, and then, the memory is kept in hot atmosphere at 85° C. After that, the written values are read out at room temperature with a standard voltage, in order to examine the ratio of the bad bits.

In the experiment, data is written into the same memory cell with changing the time length for writing. Note that so-called endurance is performed for approximately 1000 times before and after changing the time length for writing, in order to prevent an experiment from affecting the next experiment. Here, the endurance is a process of writing values "1" and "0" alternately, which is performed for eliminating polarization of the hysteresis.

As FIG. 5 shows, in the case where Tw0 is fixed to 100 nsec and Tw1 is changed, the ratio of bad bits becomes not more than 5% when Tw1 is not more than 60 nsec. This is a sufficient yield.

Figure 6:
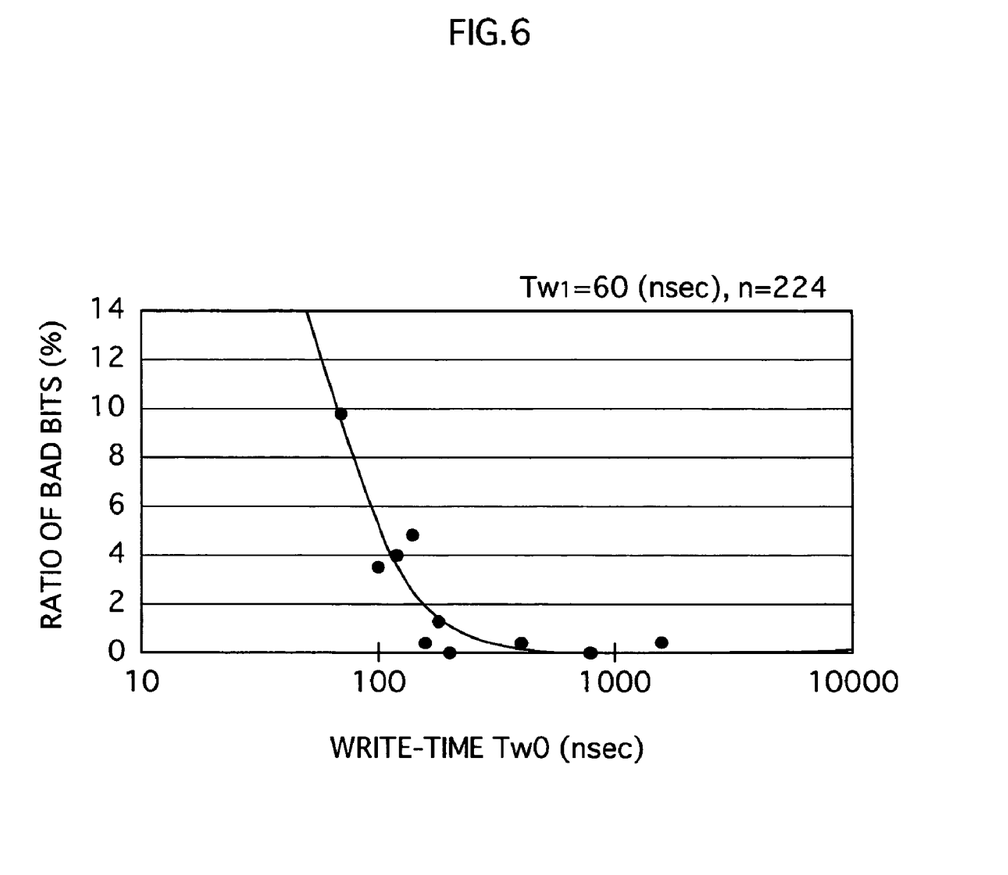
FIG. 6 is a graph showing a ratio of bad bits (unreadable bits) in the case of changing a length of a write-time for applying a write-voltage for writing a value "0" into a ferroelectric memory 1 according to the first embodiment of the present invention.

FIG. 6 is a graph showing a ratio of bad bits that are occurred in the case of changing the time length for applying voltage for writing the value "0" into the ferroelectric memory 1, under the same condition as FIG. 5.

FIG. 6 shows the result of changing Tw0 when Tw1 is fixed to 60 nsec.

FIG. 5 shows the result of changing Tw1 when Tw0 is fixed to 100 nsec.

As FIG. 6 shows, the ratio of bad bits becomes almost 0% when Tw0 is equal to or more than 200 nsec in the case where Tw1 is 60 nsec. Also, as FIG. 5 shows, the ratio of bad bits becomes almost less than 5% when Tw1 is equal to or less than 60 nsec in the case where Tw0 is 100 nsec. Therefore, 200 nsec is the most appropriate value for Tw0 when Tw1 is 60 nsec.

Considering only the ratio of bad bits and the speed of the writing, it is preferable that Tw1 is as short as possible. However, from the viewpoint of long-term reliability, it is preferable that Tw1 is long. Therefore, 60 nsec is the most appropriate value for Tw1.

2. The Second Embodiment

A ferroelectric memory according to the second embodiment is a ferroelectric memory that stores four values with use of the asymmetric programming method.

2-1. The Structure of the Ferroelectric Memory

Figure 7:
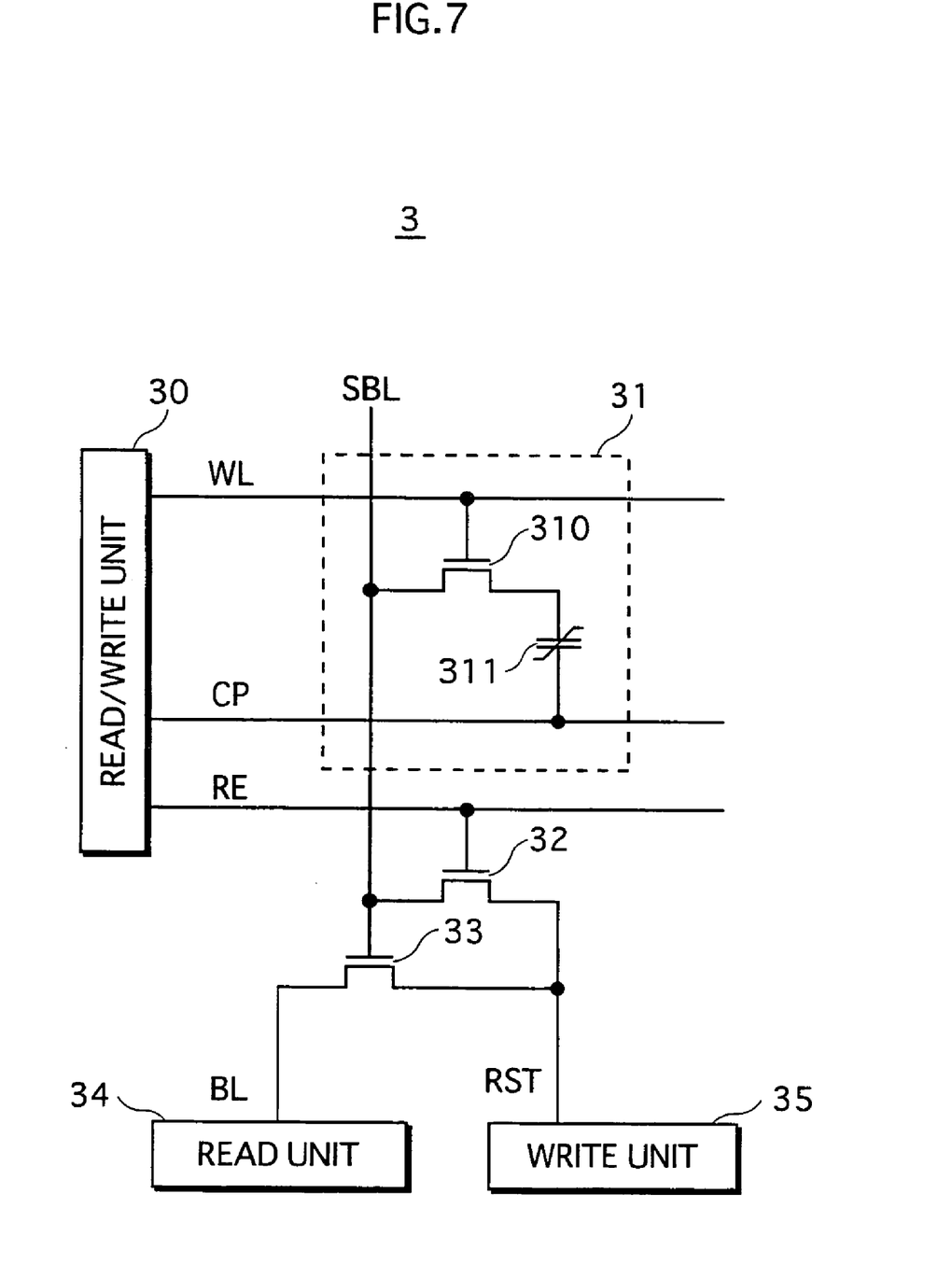
FIG. 7 shows a circuit structure of a memory cell included in a ferroelectric memory according to the second embodiment of the present invention, and peripheral circuits.

FIG. 7 shows a circuit structure of a memory cell included in the ferroelectric memory according to this embodiment, and peripheral circuits. As FIG. 7 shows, a memory cell 31 included in a ferroelectric memory 3 stores two-bit information with use of a field-effect transistor 310, and a ferroelectric capacitor 311. This circuit structure is called 1T1C (one transistor, one capacitor)-type structure. In the second embodiment, the two-bit information is stored by the ferroelectric memory 3 with use of four polarization states, namely "a", "b", "c" and "d."

Also, the ferroelectric memory 3 includes, as peripheral circuits, a read/write unit 30, a read unit 34, a write unit 35 and transistors 32 and 33. The read/write unit 30 drives a word line WL, a memory cell plate line CP, and a reading control line RE. The write unit 35 drives reset control line RST. The read unit 34 drives bit lines BL.

2-2. The Writing Operation by the Ferroelectric Memory 3

The operation of writing data into the memory cell 31 is described next. FIG. 8 is a timing chart in the case of writing values "a" and "b" into the memory cell 31. FIG. 9 is a timing chart in the case of writing values "c" and "d" into the memory cell 31. In FIG. 8 and FIG. 9, signs t21 to t24, t31 to t36, t41 to t46 and t51 to t54 represent times respectively. Signs "H" and "L" show that an applied voltage is at a high level and at a low level respectively. As an example, it is assumed here that the high level is 1.8 V and the low level is 0.0 V, and Vcpwa, Vcpwb, Vrstc and Vrstd are 1.8V, 1.3V, 1.3V and 1.8V respectively.

(1) The Operation of Writing the Value "a"

Figure 8A:
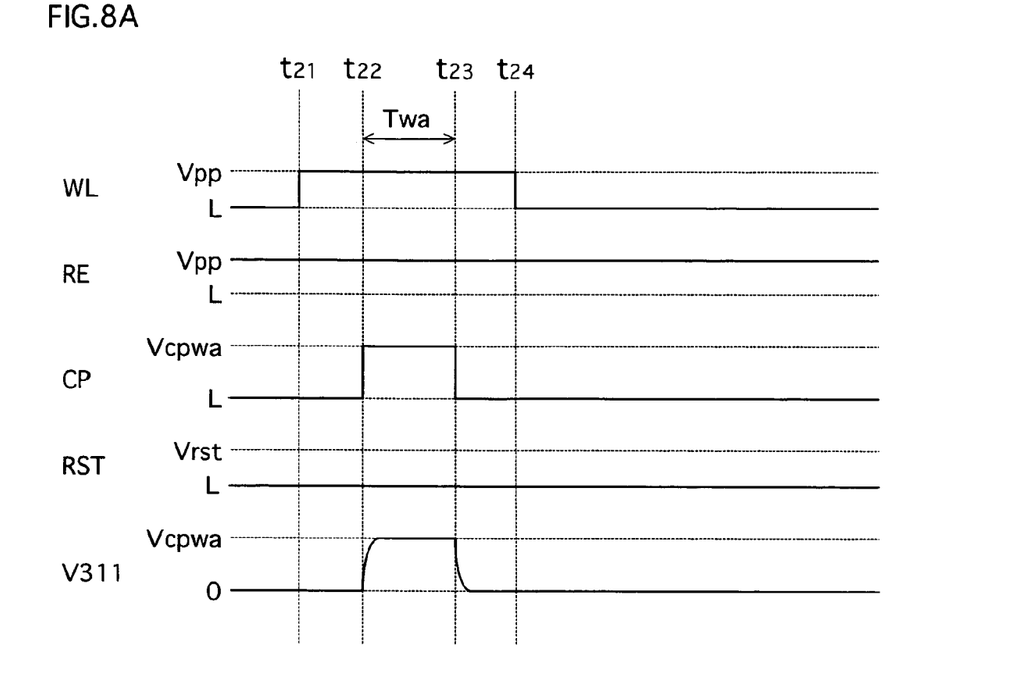
FIG. 8 is a timing chart in the case of writing values "a" and "b" into a memory cell 31 included in a ferroelectric memory according to the second embodiment of the present invention.

FIG. 8A is a timing chart in the case of writing the value "a" into the memory cell 31.

Before the time t21, the voltage applied to the word line WL is at the low level. The voltage applied to the reading control line RE is at the high level (Vpp level), and the voltages applied to the memory cell plate line CP and the reset control line RST are at the low level. Also, the voltage V311 applied to the ferroelectric capacitor 311 is 0 V.

At the time t21, the ferroelectric memory 3 changes the level of the voltage applied to the word line WL to the Vpp level. This turns on the field-effect transistor 310. At the time t22, the ferroelectric memory 3 changes the level of the voltage applied to the memory cell plate line CP to Vcpwa. This raises the voltage V311 to Vcpwa. Here, the period Twa between the time t22 and the time t23 is 30 nsec.

At the time t23, the ferroelectric memory 3 changes the level of the voltage applied to the memory cell plate line CP to the ground potential. This lowers the voltage V311 to 0 V. At the time t24, the ferroelectric memory 3 changes the level of the voltage applied to the word line WL to the low level. Then, the writing operation finishes.

(2) The Operation of Writing the Value "b"

Figure 8B:
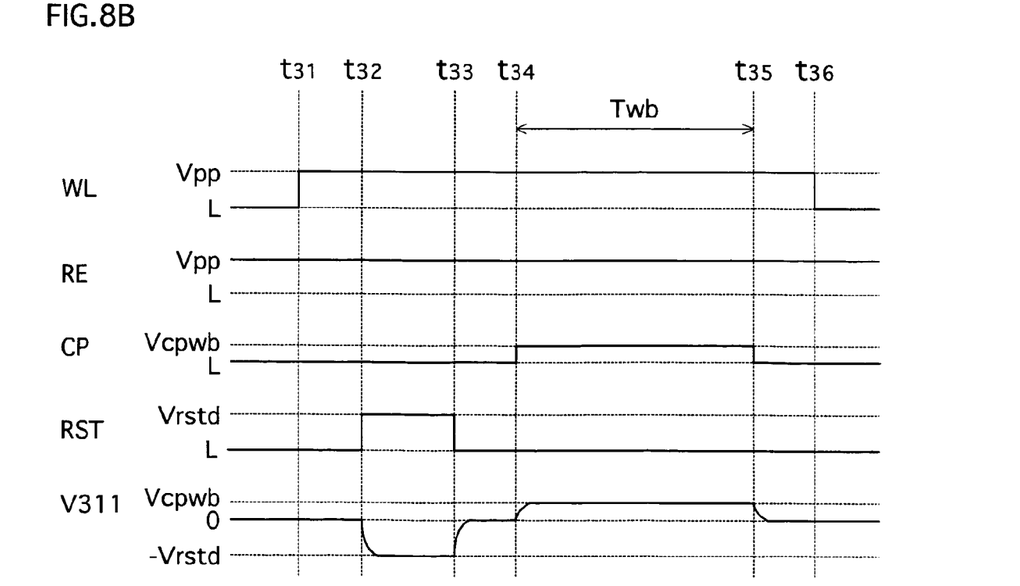

FIG. 8B is a timing chart in the case of writing the value "b" into the memory cell 31. Before the time t31, the voltages are in the same states as the states of the voltages in FIG. 8A before the time t21.

At the time t31, the ferroelectric memory 3 changes the level of the voltage applied to the word line WL to the Vpp level. This turns on the field-effect transistor 310. At the time t32, the ferroelectric memory 3 changes the level of the voltages applied to the reset control line RST to Vrstd. This changes the voltage V311 to −Vrstd. At the time t33, the ferroelectric memory 3 changes the level of the voltage applied to the reset control line RST to the ground potential. This changes the voltage V311 back to 0 V. At the time t34, the ferroelectric memory 3 changes the level of the voltage applied to the memory cell plate line CP to Vcpwb. This changes the voltage V311 to Vcpwb. Here, a period Twb between the time t34 and the time t35 is 150 nsec.

At the time t35, the ferroelectric memory 3 changes the voltage applied to the memory cell plate line CP to the ground potential. This changes the voltage V311 to 0 V. At the time t36, the ferroelectric memory 3 changes the voltage applied to the word line WL to the low level. Then, the writing operation finishes.

(3) The Operation of Writing the Value "c"

Figure 9A:
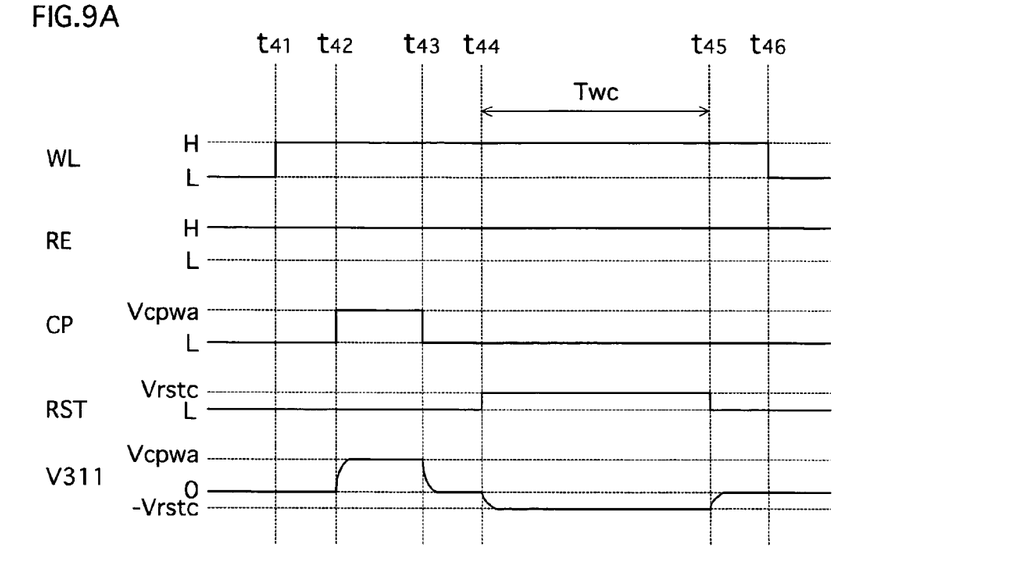
FIG. 9 is a timing chart in the case of writing values "b" and "c" into a memory cell 31 included in a ferroelectric memory according to the second embodiment of the present invention.

FIG. 9A is a timing chart in the case of writing the value "c" into the memory cell 31. Before the time t41, the voltages are in the same states as the states of the voltages in FIG. 8A before the time t21.

At the time t41, the ferroelectric memory 3 changes the level of the voltage applied to the word line WL to the Vpp level. This turns on the field-effect transistor 310. At the time t42, the ferroelectric memory 3 changes the level of the voltages applied to the memory cell plate line CP to Vcpwa. This changes the voltage V311 to Vcpwa. At the time t43, the ferroelectric memory 3 changes the level of the voltage applied to the memory cell plate line CP to the ground potential. This changes the voltage V311 back to 0 V. At the time t44, the ferroelectric memory 3 changes the level of the voltage applied to the reset control line RST to Vrstc. This changes the voltage V311 to −Vrstc. Here, a period in which the voltage Vrstc is applied to the reset control line RST, which is a period Twc between the time t44 and the time t45, is 150 nsec. At the time t45, the ferroelectric memory 3 changes the level of the voltage applied to the reset control line RST to the ground potential. This changes the voltage V311 back to 0 V. At the time t46, the ferroelectric memory 3 changes the level of the voltage applied to the word line WL to the low level. Then, the writing operation finishes.

(4) The Operation of Writing the Value "d"

Figure 9B:
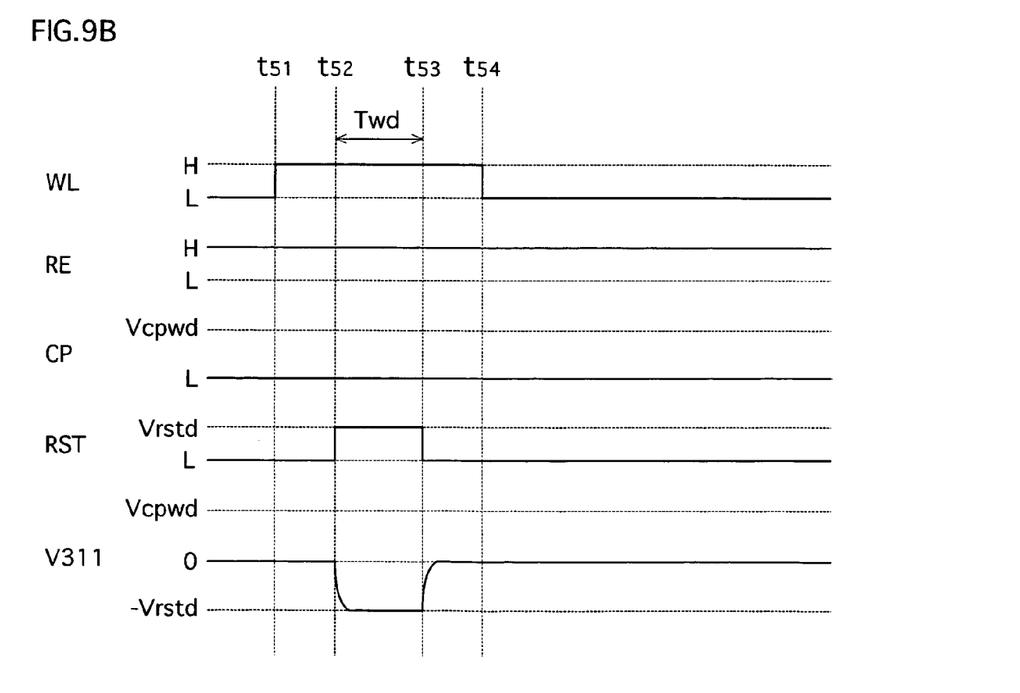

FIG. 9B is a timing chart in the case of writing the value "d" into the memory cell 31. Before the time t51, the voltages are in the same states as the states of the voltages in FIG. 8A before the time t21. At the time t51, the ferroelectric memory 3 changes the level of the voltage applied to the word line WL to the Vpp level. This turns on the field-effect transistor 310. At the time t52, the ferroelectric memory 3 changes the level of the voltages applied to the reset control line RST to Vrstd. This changes the voltage V311 to −Vrstd. The period in which the voltage Vrstd is applied to the reset control line RST, which is a period Twd between the time t52 and the time t53, is 30 nsec. At the time t53, the ferroelectric memory 3 changes the level of the voltage applied to the reset control line RST to the ground potential. This changes the voltage V311 back to 0 V. At the time t54, the ferroelectric memory 3 changes the level of the voltage applied to the word line WL to the low level. Then, the writing operation finishes.

2-3. The Control of the Polarization of the Ferroelectric Capacitor

The control of the polarization of the ferroelectric capacitor 311 is described next.

Figure 10:
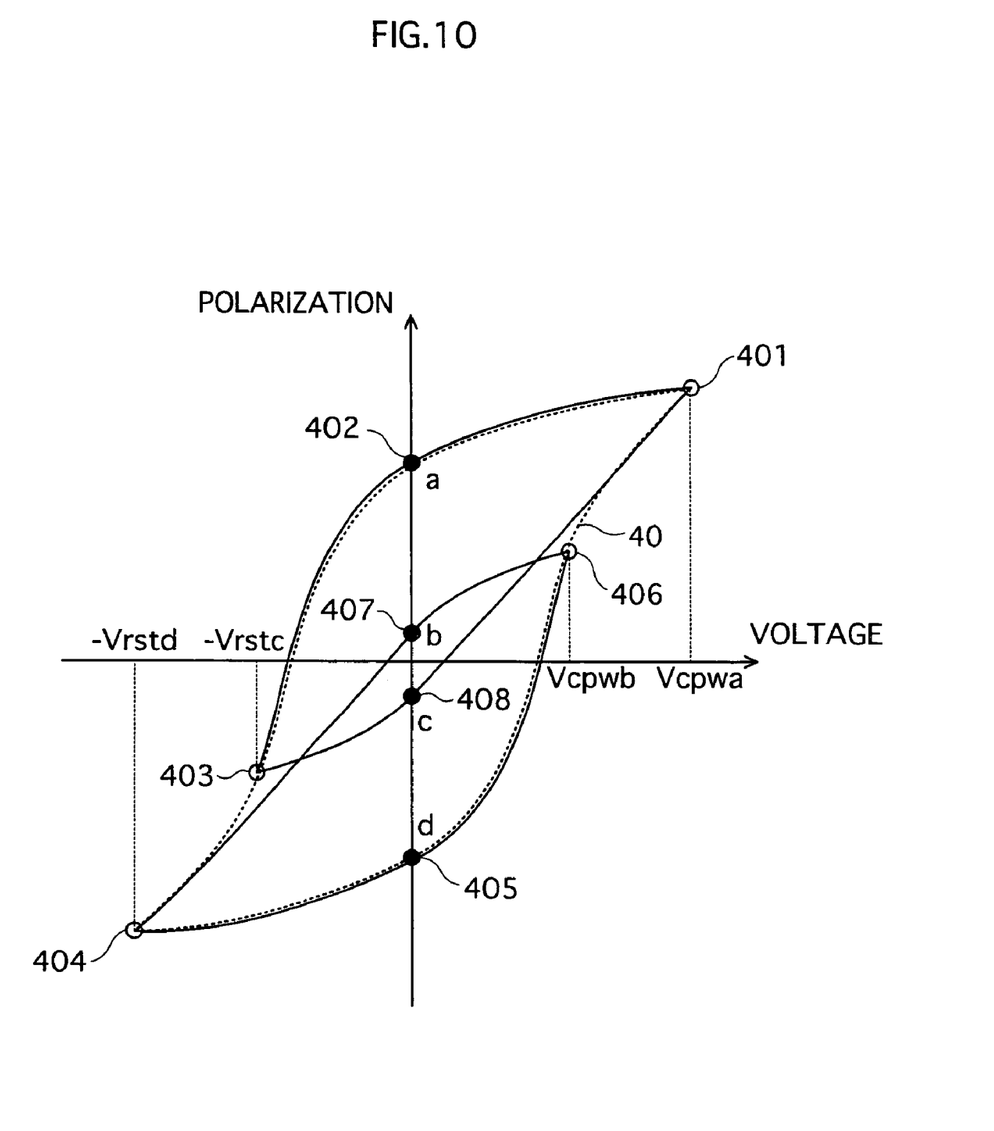
FIG. 10 is a graph showing a hysteresis curve of a ferroelectric capacitor 311 according to the second embodiment of the present invention.

FIG. 10 is a graph showing the hysteresis curve of the ferroelectric capacitor 311 according to the second embodiment. A curve 40 is the hysteresis curve of the ferroelectric capacitor 311.

As FIG. 10 shows, when the ferroelectric capacitor 311 is in a polarization state 405 or 408, it comes in a polarization state 401 after being applied a voltage Vcpwa for 30 nsec. After that, when the applying voltage is changed to the ground voltage, the ferroelectric capacitor 311 comes in a polarization state 402. This polarization state 402 represents a value "a".

When the ferroelectric capacitor 311 is in a polarization state 405, it comes in a polarization state 406 after being applied a voltage Vcpwb for 150 nsec. After that, when the applying voltage is changed to the ground voltage, the ferroelectric capacitor 311 comes in a polarization state 407. This polarization state 407 represents a value "b".

When the ferroelectric capacitor 311 is in a polarization state 402, it comes in a polarization state 403 after being applied a voltage −Vrstc for 150 nsec. After that, when the applying voltage is changed to the ground voltage, the ferroelectric capacitor 311 comes in a polarization state 408. This polarization state 408 represents a value "c".

When the ferroelectric capacitor 311 is in a polarization state 402 or 407, it comes in a polarization state 404 after being applied a voltage −Vrstd for 30 nsec. After that, when the applying voltage is changed to the ground voltage, the ferroelectric capacitor 311 comes in a polarization state 405. This polarization state 405 represents a value "d".

As described above, the polarization states can be controlled by changing the level of the voltage applied to the ferroelectric capacitor and its applying time. In other words, the changing polarization state can be stopped before reaching the saturation polarization. This allows the ferroelectric memory cell to store a plurality of values.

3. Modifications

The present invention is described based on the preferred embodiments. However, the present invention is not limited to the above-described embodiments as a matter of course. The following are possible modifications.

(1) Although not referred in the first embodiment described above, it is preferable that the applying voltage Vcpw is more than twice a coercive voltage of the ferroelectric capacitors 111 and 113, and the time Tw1 is sufficient for the saturation polarization of the ferroelectric film. Also, it is preferable that Vrst is not more than twice the coercive voltage of the ferroelectric capacitor, and the time Tw0 is an appropriate time for neutralizing the polarization. For instance, in a ferroelectric device driven by a source voltage of 1.8 V, it is preferable that Vcpw is 1.8 V, Vrst is 1.0 to 1.2 V, Tw1 is 30 to 100 nsec, and the Tw0 is 150 to 500 nsec. Note that the coercive voltage is an applying voltage for changing the polarization state of the ferroelectric capacitor.

(2) Although the 2T2C-type circuit structure is described in the first embodiment as an example, the present invention is not limited to this, as a matter of course. A 1T1C-type circuit structure or other circuit structures may be used. The present invention is applicable to all of those structures in order to gain the effect.

(3) Although the ferroelectric capacitor using the asymmetric programming method is described in the first embodiment as an example, the present invention is not limited to this, as a matter of course. The present invention is applicable to a ferroelectric capacitor using the symmetric driving method.

Figure 11:
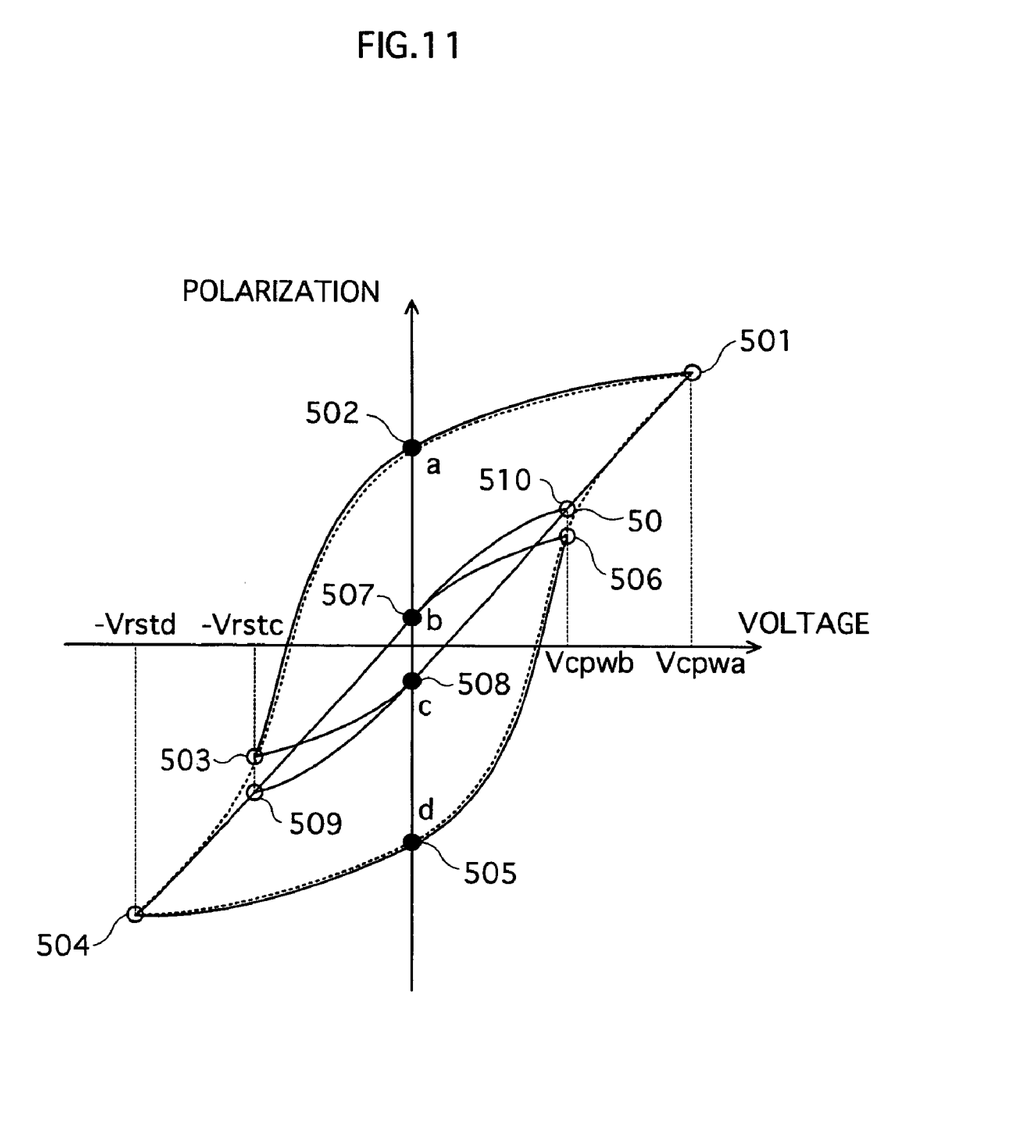
FIG. 11 is a graph showing a hysteresis curve of a ferroelectric capacitor according to the modification (3) of the present invention.

FIG. 11 is a graph showing a hysteresis curve of a ferroelectric capacitor according to this modification. As FIG. 11 shows, when the ferroelectric capacitor 311 described in the second embodiment above is in the polarization state 507, the ferroelectric capacitor 311 comes in the polarization state 508 by being applied the voltage −Vrstc for 150 nsec. Also, when the ferroelectric capacitor 311 is in the polarization state 508, the ferroelectric capacitor 311 comes in the polarization state 507 by being applied the voltage Vcpwb for 150 sec. This stabilizes the polarization states 507 and 508, whose polarization levels are intermediate between the polarization states 502 and 505. As a result, the ferroelectric capacitor 311 becomes more practical as a storage device for storing many values.

Note that the asymmetric programming method reduces the change in polarization levels compared to the conventional symmetric method, and thereby suppresses the deterioration of the ferroelectric film. Therefore, the number of times which the ferroelectric memory can be rewritten increases, and the life of the ferroelectric capacitor becomes longer. Note that the reading circuit has to be specially designed to read the signals representing values "1" and "0", between which the difference is small in the asymmetric programming method.

For reading information from the ferroelectric memory according to the present invention, so-called a destructive reading or a non-destructive reading may be used as a reading method. When the destructive read is used, the memory can be read and written only a limited number of times. However, when the non-destructive read is used, the polarization of the ferroelectric capacitor is not to be inversed at the time of reading, and therefore the deterioration of the ferroelectric film can be suppressed. This increases the limit on the number of readings. Meanwhile, there is a limit as to the number of writings, because fatigue and deterioration of the ferroelectric film occur in the case of the non-destructive read as well as in the case of the destructive read. The optimum length of the write-time for applying a voltage to an electrode of the ferroelectric capacitor, by which the polarization of the ferroelectric capacitor is to be inversed, is disclosed by Japanese laid-open patent publication No. 2001-308291 for instance.

(4) In the first embodiment described above, the write-voltage applying time for writing the value "0" is longer than the write-voltage applying time for writing the value "1". However, the present invention is not limited to this, as a matter of course. The write-voltage applying time for writing the value "1" may be longer than the write-voltage applying time for writing the value "0".

Figure 12:
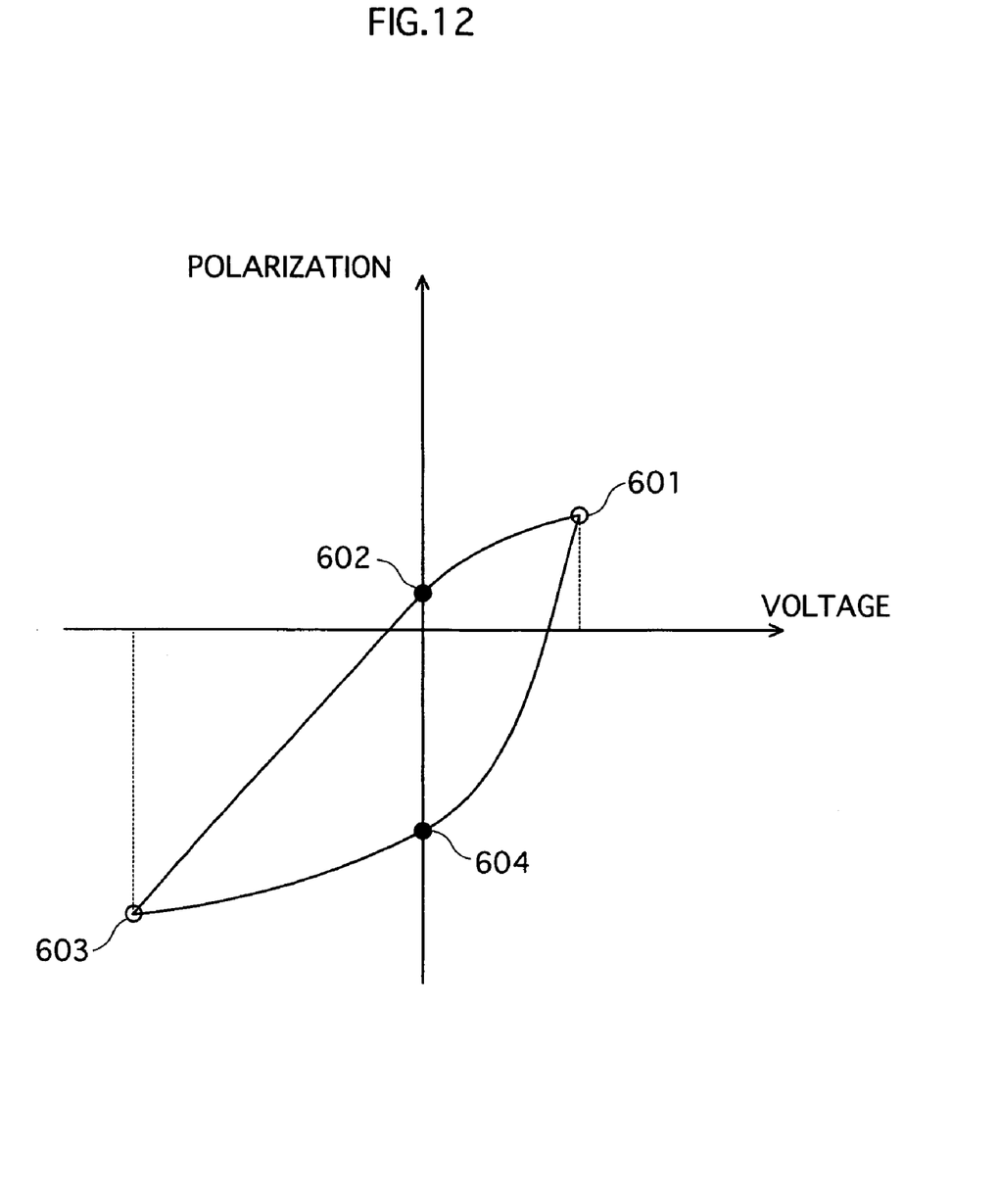
FIG. 12 is a graph showing a hysteresis curve of a ferroelectric capacitor according to the modification (4) of the present invention.

FIG. 12 is a graph showing a hysteresis curve of the ferroelectric capacitor where the write-voltage applying time for writing the value "1" is longer than the write-voltage applying time for writing the value "0". As FIG. 12 shows, the ferroelectric capacitor according to this modification comes in a polarization state 603 when a saturation voltage is applied, and then reaches a polarization state 604 that represents the value "0". When a voltage lower than the saturation voltage is applied, the ferroelectric capacitor comes in the polarization state 601, and then reaches a polarization state 602 that represents the value "1". In this case, it is preferable that the time for applying a voltage lower than the saturation voltage is longer than the time for applying the saturation voltage.

(5) In the second embodiment described above, the 1T1C-type circuit structure is taken as an example and described. However, the present invention is not limited to this, as a matter of course. A 2T2C-type structure or other structures may be used. The present invention is applicable to any structure in order to gain the effect.

(6) In the second embodiment described above, the case of storing four values in one memory cell is explained as an example. However, the present invention is not limited to this, as a matter of course. Three, five, or more values may be stored in one memory cell. No matter how many values are stored in one memory cell, the present invention is applicable to gain the effect.

(7) In the first embodiment described above, each of the read/write unit 10 and the write unit 16 controls the write-time. However, the present invention is not limited to this. The following is a possible modification.

Figure 13:
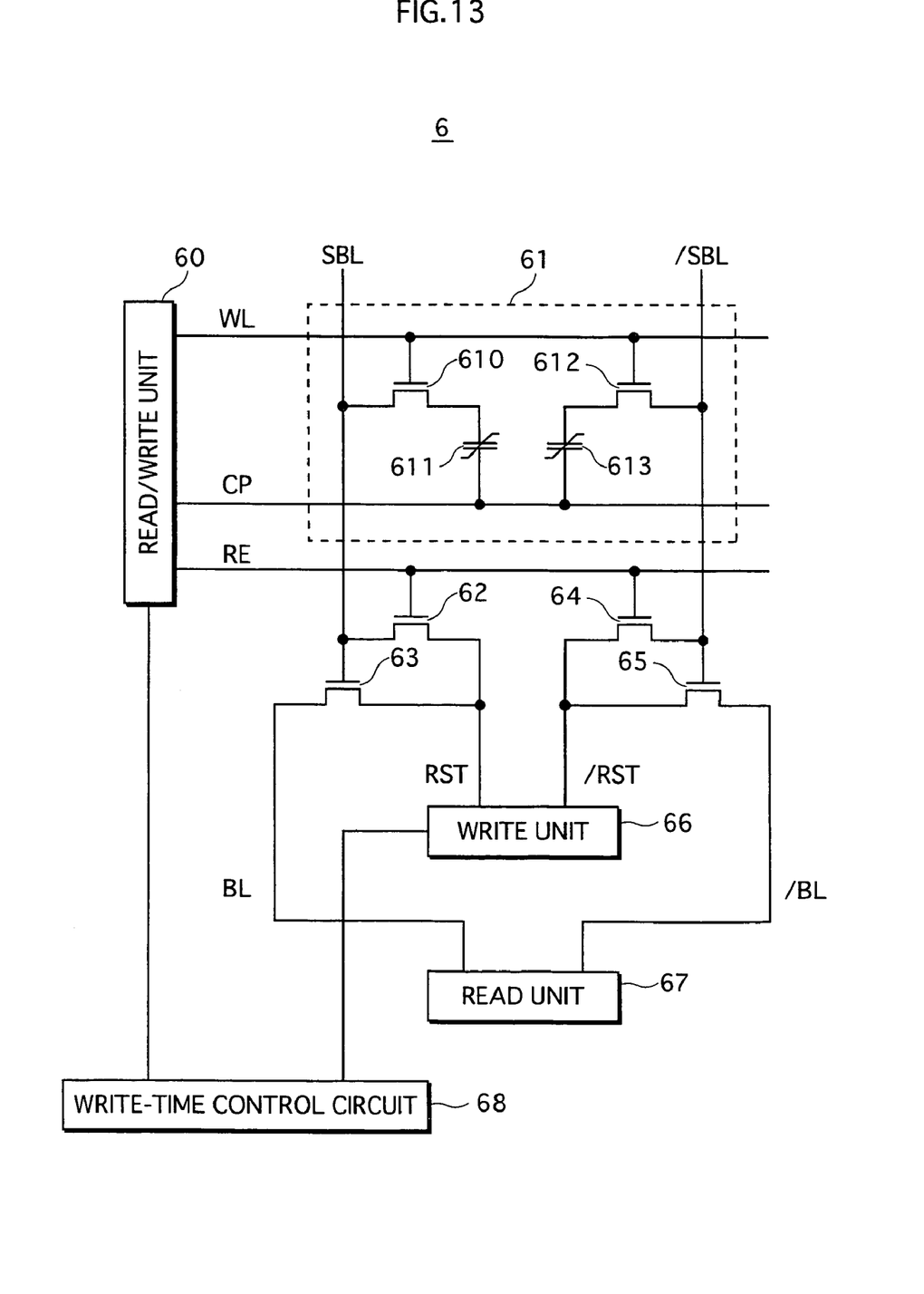
FIG. 13 shows a circuit structure of a memory cell included in a ferroelectric memory according to the modification (7) of the present invention, and peripheral circuits.

FIG. 13 shows a circuit structure of a memory cell included in a ferroelectric memory according to this modification, and peripheral circuits. As FIG. 13 shows, the ferroelectric memory 6 according to this modification includes a write-time control circuit 68. The write-time control circuit 68 inputs write-time control signals in the read/write unit 60 and the write unit 66 in order to control the write-time. This structure can be used as well to gain the same effect as the effect of the above-described embodiment.

(8) Although not referred in the first embodiment, as FIG. 4 shows, the ferroelectric memory 1 can store three values by having the polarization of one of the ferroelectric capacitors 111 and 113 come in the state of 204 or 212 when the polarization of the other capacitor is in the state of 202.

Also, with the 2T2C-type circuit structure, the ferroelectric capacitors can store four values as FIG. 10 shows by having the polarizations of the ferroelectric capacitors come in four states, more specifically, by having the polarization of one of the capacitor come in the state of 405 or 408 when the polarization of one of the capacitors is in the sate of 402 or 407.

This improves the accuracy of the reading performed by the ferroelectric capacitor even when the polarization levels are low as the polarization levels of the polarization states 407 and 408 are, because the difference between the electric potentials of the ferroelectric capacitors is large compared to the 1T1C-type structure.

Such design is applicable to not only the ferroelectric memory having the 2T2C-type structure, but to ferroelectric memories having a plurality of ferroelectric capacitors.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A ferroelectric storage device, comprising:
   a ferroelectric capacitor;
   a write-voltage applying circuit operable to apply a write-voltage to the ferroelectric capacitor and thereby cause polarization in the ferroelectric capacitor; and
   a write-time control circuit operable to control a length of a write-time during which the write-voltage applying circuit applies the write-voltage to the ferroelectric capacitor, wherein
   the write-time control circuit changes the length of the write-time in accordance with a level of the write-voltage.

2. The ferroelectric storage device of claim 1, wherein the write-time control circuit increases the length of the write-time as an absolute value of the write-voltage decreases.

3. The ferroelectric storage device of claim 1, wherein the write-voltage applying circuit changes an absolute value of the write-voltage for each polarization level corresponding to a value that is to be stored in the ferroelectric capacitor.

4. The ferroelectric storage device of claim 1, wherein the ferroelectric capacitor stores three or more values.

5. A ferroelectric storage device, comprising:
   a pair of ferroelectric capacitors;
   a write-voltage applying circuit operable to apply a different write-voltage to each ferroelectric capacitor, and thereby cause a polarization in each ferroelectric capacitor; and
   a write-time control circuit operable to control a length of a write-time during which the write-voltage applying circuit applies the write-voltage to each ferroelectric capacitor, wherein
   the write-time control circuit changes the length of the write-time in accordance with a level of the write-voltage.

* * * * *